United States Patent [19]
Imai et al.

[11] Patent Number: 5,847,419
[45] Date of Patent: Dec. 8, 1998

[54] SI-SIGE SEMICONDUCTOR DEVICE AND METHOD OF FABRICATING THE SAME

[75] Inventors: Seiji Imai; Yoshiko Hiraoka, both of Kawasaki; Atsushi Kurobe, Yamato; Naoharu Sugiyama; Tsutomu Tezuka, both of Yokohama, all of Japan

[73] Assignee: Kabushiki Kaisha Toshiba, Kawasaki, Japan

[21] Appl. No.: 931,411

[22] Filed: Sep. 16, 1997

[30] Foreign Application Priority Data

Sep. 17, 1996 [JP] Japan ................................. 8-245048
Sep. 17, 1996 [JP] Japan ................................. 8-245317

[51] Int. Cl.$^6$ ...................... H01L 29/161; H01L 27/092
[52] U.S. Cl. ......................... 257/192; 257/190; 257/351; 257/369; 257/195
[58] Field of Search ................. 257/19–20, 55, 257/65, 190, 192, 351, 369, 616, 194, 195

[56] References Cited

U.S. PATENT DOCUMENTS

| | | | |
|---|---|---|---|
| 5,155,571 | 10/1992 | Wang et al. | 257/19 |
| 5,266,813 | 11/1993 | Comfort et al. | 257/19 |
| 5,268,324 | 12/1993 | Aitken et al. | 438/217 |
| 5,461,243 | 10/1995 | Ek et al. | 257/190 |
| 5,534,713 | 7/1996 | Ismail et al. | 257/24 |

OTHER PUBLICATIONS

K. Ismail, et al., "High–Transconductance n–Type Si/SiGe Modulation–Doped Field–Effect Transistors", IEEE Electron Device Letters, vol. 13, No. 5, May 1992, pp. 229–231.

T.P. Pearsall, et al., "Enhancement–and Depletion–mode p–Channel $Ge_x Si_{1-x}$ —Modulation–Doped Fet's", IEEE Electron Device Letters, vol. EDL–7, No. 5, May 1986, pp. 308–310.

J. Welser, et al., "Strain Dependence of the Performance Enhancement In Strained–Si n–Mosfets", IEDM Technical Digest, Dec. 1994, pp. 373–376.

V.P. Kesan, et al., "High Performance 0.25 um p–Mosfets With Silicon–Germanium Channels For 300K and 77K Operation", IEDM Technical Digest, Dec. 1991, pp. 25–28.

Primary Examiner—John Guay
Attorney, Agent, or Firm—Oblon, Spivak, McClelland, Maier & Neustadt, P.C.

[57] ABSTRACT

A semiconductor device comprises a semiconductor substrate, a first semiconductor layer under compressive strain formed on the semiconductor substrate, a p-type MISFET (Metal Insulator Semiconductor Field Effect Transistor) formed in a predetermined region of the first semiconductor layer, a second semiconductor layer in a lattice-relaxation condition formed on the first semiconductor layer in a region other than the predetermined region with an insulating film lying therebetween, wherein the insulating film has an opening and the first and second semiconductor layers are connected through the opening, a third semiconductor layer under tensile strain formed on the second semiconductor layer, and an n-type MISFET (Metal Insulator Semiconductor Field Effect Transistor) formed in the third semiconductor layer.

4 Claims, 11 Drawing Sheets

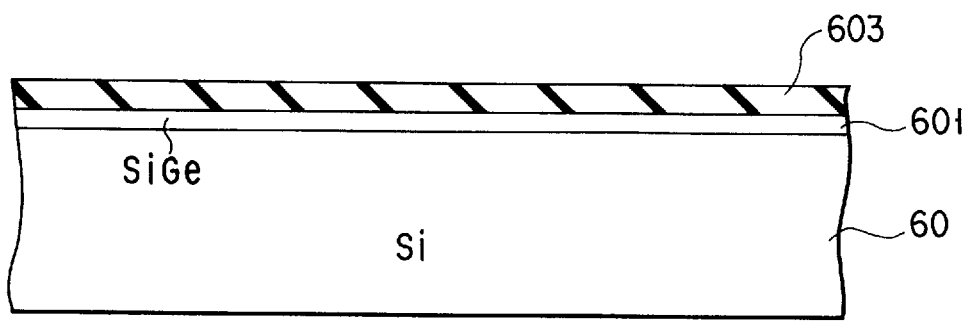
F I G. 1 3 A
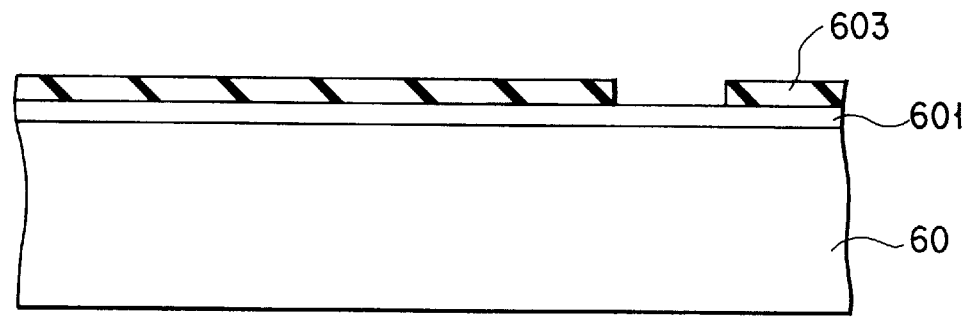
F I G. 1 3 B
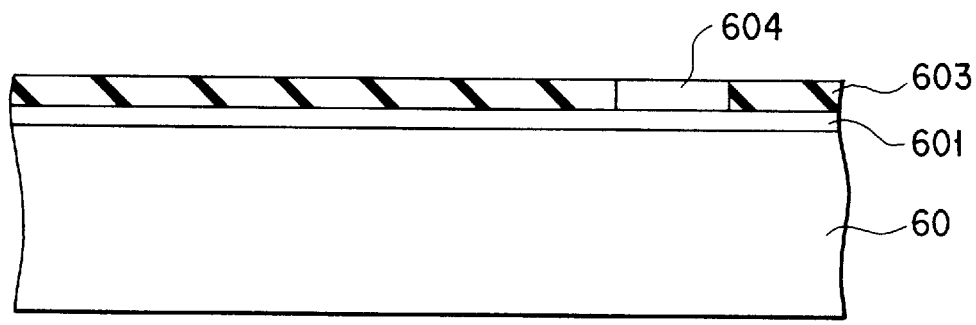
F I G. 1 3 C
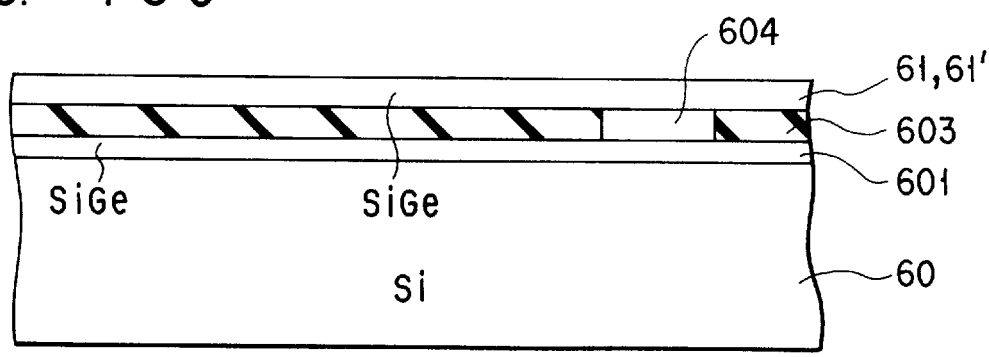
F I G. 1 3 D

SI-SIGE SEMICONDUCTOR DEVICE AND METHOD OF FABRICATING THE SAME

BACKGROUND OF THE INVENTION

The present invention relates to a semiconductor device including an MOS transistor. Particularly, the present invention relates to a semiconductor device which has a higher speed by utilizing a strain of the crystal in a channel and a method of fabricating the same.

More particularly, the present invention relates to a semiconductor device that an n-channel hetrojunction field effect transistor and a p-channel hetrojunction field effect transistor is formed in the same substrate.

Recently, utilization of a heterojunction structure composed of silicon (Si) and germanium (Ge) has been tried in order to improve a MOS transistor toward a higher speed. For example, it has been proposed a method in which an Si layer under tensile strain formed on an Si substrate with a relaxed-SiGe buffer layer lying therebetween in order to realize an n-channel MOS transistor (hereinafter abbreviated as nMOSFET) with a higher speed. It has been known that a MOS transistor with a higher speed can be obtained in an Si layer under tensile strain, since an electron mobility is higher in a strained Si layer, compared with bulk Si (IEDM Tech. Digest, 1994, p 373–376).

However, in order to obtain an Si layer under tensile strain in the above technology, an SiGe buffer layer must be formed as thick as of the order of 2 μm, since the buffer layer has to be fully relaxed. A MOSFET fabricated using such a thick film causes increase in parasitic capacitance between source/drain regions which is adversely resulted in difficulty in improvement toward a higher speed.

On the other hand, it has been known a method in which an SiGe layer under compressive strain is formed on an Si substrate and the layer is utilized as a channel in order to achieve a higher speed of a p-type MOS transistor (hereafter abbreviated as pMOSFET). Increase in speed of the pMOSFET can be attained, since a hole mobility is larger in the SiGe layer under compressive strain, compared with that in a bulk Si (IEEE ELECTRON DEVICE LETTERS, VOL 15, No. 10, 1994, p 402–405). In order to form the SiGe layer under compressive strain, it is necessary that a thickness of the layer should be equal to or less than a critical thickness which is determined by a percentage composition of Ge in the layer and a growth temperature employed (J. Appl. Phys., vol. 70, No. 4, 1991, P 2136–2151).

In order to fabricate an LSI with higher integration and lower power consumption, integrated circuit in the form of combination of an nMOSFET and a pMOSFET has to be formed. In this case, there arises incompatible requirements that a thicker SiGe layer as a substrate is to be used in an nMOSFET, since it is necessary for it to be in a lattice-relaxation condition, whereas a thin SiGe layer is to be used in a pMOSFET utilizing the layer under compressive strain. That is, since there are differences in thickness to be needed and degree of strain between the nMOSFET and the pMOSFET, satisfactory characteristics cannot be obtained, even if these transistors are integrated in the same substrate.

It is conceived that the pMOSFET and the nMOSFET are independently formed in completely separate layers, but in this case the number of film formation steps is increased and thereby a fabrication process is complicated by a great margin, whereby integration of the transistors on the same substrate loses its meaning. Moreover, there remains another problem of a disadvantage to a higher speed which is caused by a thick film structure of the SiGe layer in an nMOSFET.

Heterojunction field effect transistor (or heterojunction FET) is a field effect transistor in which high mobility carriers with two-dimensionally distribution produced at a heterojunction interface between different kinds of semiconductors are utilized. Typical structures of the transistor are shown in FIGS. 1A and 1B. FIG. 1A is a sectional view showing an internal structure of an n-channel heterojunction FET. A first semiconductor layer 111 is formed on a substrate 110 in epitaxial growth and a second semiconductor layer 112 which is smaller in electron affinity than the first semiconductor layer 111 is layered on the first layer 111. In the case where the whole or part of the second semiconductor layer 112 is doped with an n-type dopant, electrons in the second semiconductor layer 112 are injected into the first semiconductor layer 111 and thereby a channel is produced by accumulation of electrons 118 at a heterojunction interface between the first and second semiconductor layers 111 and 112 on the side of the first semiconductor layer 111, as shown in FIG. 1B.

A concentration of electrons in the channel is controlled by a gate electrode 114 and a current between source/drain electrodes 115a, 115b which are disposed on both side of the gate electrode 114 in a sandwiching manner can be thereby controlled by a applied voltage to the gate electrode 114. A much higher mobility can be realized, compared with a FET doped with impurity in a ordinary channel region, since the first semiconductor layer 111 is undoped or doped at a low level and electrons can travel along the heterojunction interface without receiving impurity scattering. That is, a FET with high performance can be attained by separating spatially an impurity doped layer and the channel under utilization of a heterojunction.

Typical structures of a p-channel hetrojunction FET are shown in FIGS. 2A and 2B. FIG. 2A is a sectional view of a device structure of a p-channel hetrojunction FET. A first semiconductor layer 121 and a second semiconductor layer 122 p-doped whose energy of the upper end of the valence band is lower than that of the first semiconductor layer 121 are layered on a substrate 120 and a gate electrode 126 is formed on part of the second semiconductor layer 122 and source and drain electrodes 127a, 127b are formed in such a manner that the gate electrode 126 lies between the source and drain electrodes.

Holes 121 in the second semiconductor 122 are injected to the first semiconductor layer 121 and a channel is produced at a heterojunction interface between the first and second semiconductor layers 121 and 122 on the side of the first semiconductor layer 121, as shown in FIG. 2B. In a p-channel heterojunction FET, too, a high hole mobility can be obtained in a similar manner to that of an n-channel hetrojunction FET, since an impurity doped layer and a hole channel are spatially separated.

In a silicon based LSI, a complementary MOS inverter is an important device to fabricate an LSI with a high degree of integration and low power consumption and requirements for performance of n-channel and p-channel MOSFETS have, therefore, become increasingly severer. In such a trend, very recently, utilization of a heterojunction structure between silicon and germanium has been tried to develop a silicon based MOSFET with a still higher performance.

For example, in order to achieve a higher speed in a MOSFET, a method has been proposed that a silicon layer under tensile strain is formed on a silicon substrate with a relaxed silicon germanium buffer layer lying therebetween in order to realize an n-channel MOSFET with a higher speed. It has been known that in the silicon layer in a tensile condition, an nMOSFET can be improved toward a higher speed, since an electron mobility is larger, compared with bulk silicon.

It has been also known that, in order to attain a pMOSFET with a higher performance, a silicon-germanium layer under compressive strain is formed on a silicon substrate and the layer is utilized as a channel. Since a hole mobility in the silicon-germanium layer under compressive strain is larger, compared with that in bulk silicon, a pMOSFET can be improved toward a higher speed.

However, there has been a problem in fabrication of a complementary MOS inverter. In an nMOSFET using an SiGe layer under tensile strain, it has been required that SiGe as a substrate is in a lattice-relaxation condition and a thickness of the layer is large, while, in a pMOSFET using an SiGe layer under compressive strain, it has been required that the layer is thin. In other words, since, the nMOSFET and the pMOSFET are different in thickness and degree of strain and therefore these field effect transistors cannot be integrated on the same substrate in order to acquire a satisfactory characteristics.

It is conceivable to form a pMOSFET and an nMOSFET in completely separate layers, but, in this case, a fabrication process becomes more complicated by a great margin, as the number of film formation steps is increased, whereby it loses its meaning to integrate both field effect transistors in the same substrate. This problem is not a problem which is limited to a MOSFET, but it is also a problem in the case of a FET using a schottky gate.

As described above, there has been conventionally problems in integration of a pMOSFET and an nMOSFET on the same substrate that there is a disadvantage in attaining a higher speed originating from a large thickness structure of an nMOSFET and that degrees of strain required for both MOSFETs are different.

Conventionally, it has been sufficient to form a complementary circuit combining an n-channel heterojunction FET and a p-channel heterojunction FET, in order to fabricate an LSI with a high degree of integration and low power consumption, whereas, in a combination between an n-channel heterojunction FET using a silicon layer under tensile strain and a p-channel heterojunction FET using a silicon germanium layer under compressive strain, degrees of strain of respective layers are different and therefore both FETs are very difficult to be integrated in the same substrate.

BRIEF SUMMARY OF THE INVENTION

It is an object of the present invention to provide a semiconductor device, in which an Si layer under tensile strain and an SiGe layer under compressive strain can be integrated in good matching on the same substrate using a thin film layer structure, and which contributes to realization of a integrated transistor with a high speed and a high performance and a method of fabricating the same.

It is another object of the present invention to provide a semiconductor device, in which silicon based n-channel FET and silicon based p-channel FET can be fabricated in good matching, and which contributes to realization of integrated circuit with a higher speed and a higher performance.

A semiconductor device according to a first aspect of the present invention is a semiconductor device in which a pMOSFET and an nMOSFET are integrated on the same substrate, characterized by comprising a semiconductor substrate; a first semiconductor layer under compressive strain formed on the semiconductor substrate; a p-type MISFET (Metal Insulator Semiconductor Field Effect Transistor) formed in a predetermined region of the first semiconductor layer; a second semiconductor layer in a lattice-relaxation condition formed on the first semiconductor layer in a region other than the predetermined region with an insulating film lying therebetween, wherein the insulating film has an opening and the first and second semiconductor layers are connected through the opening; a third semiconductor layer under tensile strain formed on the second semiconductor layer; and an n-type MISFET (Metal Insulator Semiconductor Field Effect Transistor) formed in the third semiconductor layer.

A method of fabrication the semiconductor device, is characterized by comprising the steps of: forming a first semiconductor layer under compressive strain; forming an insulating film having an opening on the first semiconductor layer; depositing a semiconductor layer having an amorphous silicon-germanium as a principal component on the insulating film; forming a second semiconductor layer in a lattice-relaxation condition by subjecting the semiconductor layer having the amorphous silicon-germanium as a principal component to a heat treatment; forming a third semiconductor layer under tensile strain on the second semiconductor layer; removing parts of the third and second semiconductor layers; forming a p-type MISFET (Metal Insulator Semiconductor Field Effect Transistor) in a region of the first semiconductor layer exposed after the parts of the third and second semiconductor layers have been removed; and forming an n-type MISFET (Metal Insulator Semiconductor Field Effect Transistor) in the third semiconductor layer.

Preferred embodiments of the first aspect of the present invention are named as follows:

(1) To use a channel region formed in an Si layer under tensile strain as a region in which electrons mainly flow and to use a channel region formed in an SiGe region under compressive strain as a region in which holes mainly flow.

(2) An insulating film formed on a first semiconductor (SiGe) layer is obtained in such a manner that, after an Si layer is epitaxially grown on the first semiconductor (SiGe) layer, the Si layer is transformed to an oxide film by thermal oxidation.

(3) To form a SiGe by selective epitaxial growth in openings in the silicon oxide film, before an amorphous SiGe layer is formed on the silicon oxide film.

According to the present invention, a pMOSFET can be formed in a first SiGe layer under compressive strain, though there are available a structure composed of layers with as small a number as three of a first SiGe layer/a second SiGe layer/an Si layer and an nMOSFET can be formed in the Si layer under tensile strain. Therefore, the pMOSFET and an nMOSFET can be both improved toward a higher speed.

In this case, in order to form the Si strain layer under tensile strain, it is necessary to form an SiGe layer in a lattice-relaxation condition as a substrate and the SiGe layer has to be formed as a thick film. In the present invention, however, the SiGe layer can be produced by crystallization with annealing of an amorphous SiGe layer after its growth and thereby the SiGe layer keeps its lattice-relaxed condition even with a smaller thickness of the layer. This contributes to decrease in parasitic capacitance between source/drain regions and is effective to realization of a higher speed.

A semiconductor device according to a second aspect of the present invention, in which p-channel and n-channel heterojunction FETs are integrated on the same substrate, is characterized by comprising: a semiconductor substrate; a first semiconductor layer in a lattice-relaxation condition served as a electron supplying layer formed on the semiconductor substrate; a second semiconductor layer under tensile strain served as a supplying layer for electrons and holes, formed on the first semiconductor layer; a third semiconductor layer in a lattice-relaxation condition served as a hole channel selectively formed in the second semiconductor layer; a p-channel heterojunction FET having a gate electrode disposed on the third semiconductor layer in part of a region thereof and source/drain electrodes which are disposed on the third semiconductor layer in such a manner that the gate electrode lies between the both electrodes; and an n-channel heterojunction FET having a gate electrode disposed on the second semiconductor layer in part of a region thereof other than a region where the third semiconductor layer is formed and source/drain electrodes which are disposed on the second semiconductor layer in such a manner that the gate electrode lies between the both electrodes.

Preferred embodiments of the first aspect of the present invention are named as follows:

(1) The p-channel and n-channel heterojunction FETs are both of a normally-off type.

(2) A third semiconductor layer and part of a second semiconductor layer are both removed in a region other than where the p-channel heterojunction FET is formed and a thickness of the second semiconductor layer is smaller than that of a region other than where the n-channel heterojunction FET is formed.

(3) Gate electrodes of two kinds of heterojunction FETs are connected to each other to form an input electrode and drain electrodes of the two kinds of heterojunction FETs are connected to each other to form an output electrode, wherein individual input electrodes of the two kinds of heterojunction FETs work as electric source electrodes.

(4) A first semiconductor layer is n-doped layer, a region of the second semiconductor layer in which a p-channel heterojunction FET is formed is p-doped layer, a region of the second semiconductor layer in which an n-channel heterojunction FET is formed is undoped and the third semiconductor layer is undoped.

(5) A gate electrode is a schottky gate directly formed on a semiconductor layer.

(6) The gate electrode is formed on the semiconductor layer with an insulating film lying therebetween.

According to the second aspect of the present invention, three layers of a lattice-relaxed silicon germanium layer (the first semiconductor layer), a silicon layer under tensile strain (the second semiconductor layer) and a lattice-relaxed silicon-germanium (the third semiconductor layer) are only layered on a silicon substrate and thereby the p-channel and n-channel FETs can be formed on the same substrate. Each FET has a layered structure composed of a carrier supplying layer and a channel layer, which structure is a inverted structure in which the carrier layer is disposed on the side of the gate.

In the n-channel heterojunction FET, the first semiconductor layer is an impurity doped layer and the second semiconductor is undoped, so that the undoped layer works as a electron channel. Since the silicon layer which works as an electron channel is under tensile strain, an electron mobility is larger than that of bulk silicon. Therefore, the electron channel and the impurity doped layer can be separated and a mobility in the electron channel can be increased, so that an operation speed can be improved toward a higher speed.

In the p-channel heterojunction FET, the second semiconductor layer is doped with impurity and the third semiconductor layer is undoped, wherein the undoped silicon-germanium layer works as a hole channel. A hole mobility in silicon-germanium is larger than that of bulk silicon. Therefore, the hole channel and the impurity doped layer can be separated and an operation speed can be improved toward a higher speed.

If a heterojunction FET is formed in a common structure, it cannot be realized in a structure of three layers only, as in the present invention but a more number of layers is required to form the FET. The reason why is because, in Si layer under tensile strain and SiGe layer in a lattice-relaxation condition, electrons run through the Si layer and holes run through the SiGe layer in the respective energy band states but, since there is almost no difference in energy at the bottom of the valence band therebetween, electrons cannot be accumulated at the heterojunction interface and therefore a heterojunction FET cannot be fabricated.

In the present invention, a carrier supplying layer doped with impurity and an undoped layer or a layer doped at a low level are formed in a inverted structure and the first to third semiconductor layers are selected as defined in claims, and thereby the p-channel and n-channel heterojunction FETs can be integrated on the same substrate in a three layer structure composed of semiconductor layers.

According to the first aspect of the present invention, integrated circuit with a higher speed and higher performance in which characteristics of the Si layer under tensile strain and the SiGe layer under compressive strain are fully utilized can be actually fabricated, since an n-type MOS transistor using the Si layer under tensile strain and a p-type MOS transistor using the SiGe layer under compressive strain are formed in a good matching manner on the same substrate based on a thin film structure.

According to the second aspect of the present invention, an n-channel heterojunction FET with a high performance and a p-channel heterojunction FET with a higher performance can be easily formed on the same substrate at the same time, wherein a heterojunction between the silicon-germanium in a lattice-relaxation condition and the silicon under tensile strain is utilized.

Additional objects and advantages of the present invention will be set forth in the description which follows, and in part will be obvious from the description, or may be learned by practice of the present invention. The objects and advantages of the present invention may be realized and obtained by means of the instrumentalities and combinations particularly pointed out in the appended claims.

BRIEF DESCRIPTION OF THE SEVERAL VIEWS OF THE DRAWINGS

The accompanying drawings, which are incorporated in and constitute a part of the specification, illustrate presently preferred embodiments of the present invention and, together with the general description given above and the detailed description of the preferred embodiments given below, serve to explain the principles of the present invention in which:

FIGS. 13A to 13D are sectional views showing a fabrication process of a complementary inverter according to a seventh embodiment of the present invention.

DETAILED DESCRIPTION OF THE INVENTION

Details of the present invention will be described in reference to the embodiments shown in the attached drawings.

FIGS. 3A to 3K are the sectional views showing a fabrication process of a semiconductor device according to a first embodiment.

Figure 1A:
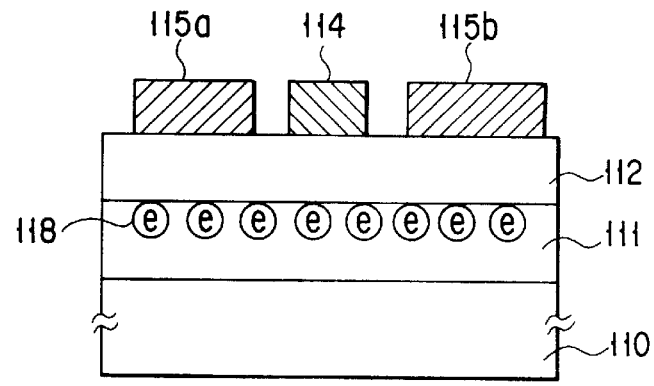
FIGS. 1A and 1B are diagrams respectively showing a device structure and a principle operation of a typical n-channel heterojunction FET.
Figure 1B:
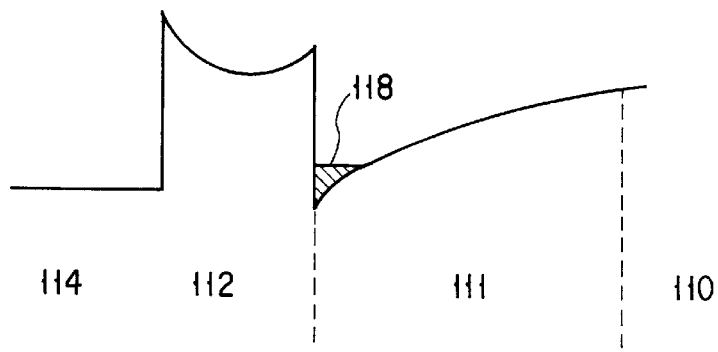
Figure 2A:
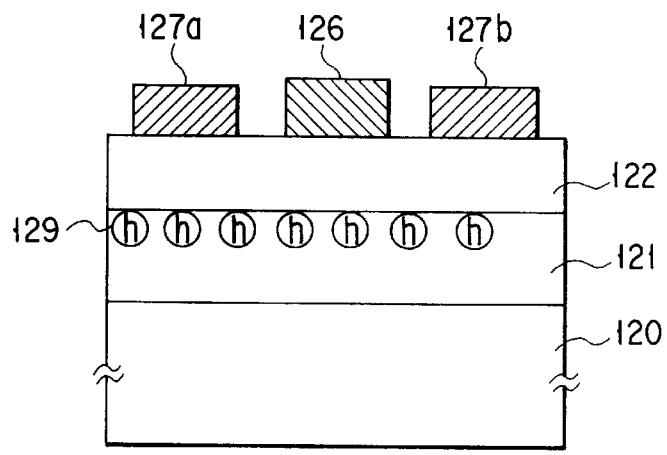
FIGS. 2A and 2B are diagrams respectively showing a device structure and a principle operation of a typical p-channel heterojunction FET.
Figure 2B:
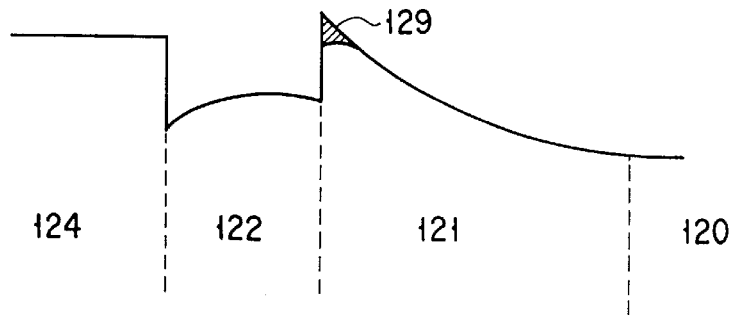
Figure 3A:
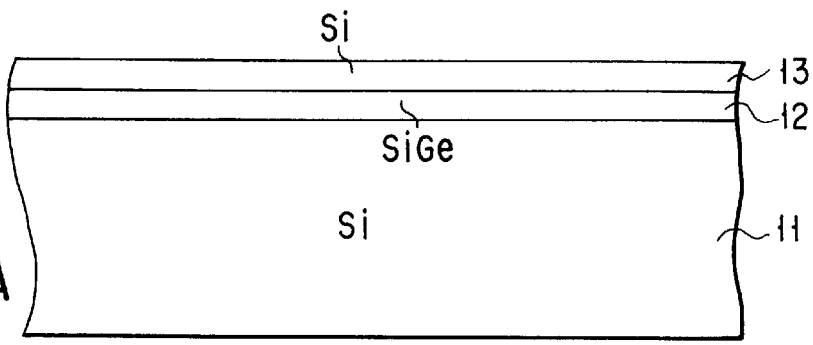
FIGS. 3A to 3K are sectional views showing a fabrication process of a semiconductor device according to a first embodiment.

As shown in FIG. 3A, an Si substrate 11 is cleaned, for example, by means of an RCA method and an $Si_{0.7}Ge_{0.3}$ layer (a first silicon-germanium layer) 12 is formed on the cleaned substrate 11 at a growth temperature of 500° C. to a thickness of the order of 50 nm by means of an epitaxial growth process. In order to place the SiGe layer 12 under compressive strain, a thickness of the layer is required to be set at a thickness equal to or less than a value which is determined by a Ge fraction and a growth temperature.

A Ge fraction in the SiGe layer is desirably in the range 0.2 to 0.5%. In the case where a Ge fraction is less than 0.2%, increase in a mobility in the SiGe layer 12 cannot be expected. On the other hand, in the case where a Ge fraction is more than 0.5%, a quality and morphology of the SiGe layer 12 are degraded and no improvement in electric characteristics can be hoped either.

When a growth temperature is at about 500° C., a thickness of the SiGe layer 12 is preferably in the range of 40 to 300 nm for a Ge fraction in the range of 0.2 to 0.5%. The reason why is that, if a thickness is larger than the upper limit, it is difficult to place the SiGe layer 12 under compressive strain.

Next, an Si layer 13 with a thickness of 10 nm is formed on the SiGe layer 12 at 500° C. by means of the epitaxial process. In this case, a thickness of the Si layer 13 is preferably equal to or less than 10 nm. The reason why is that it is necessary for suppression of a short channel effect and increase in driving current by forming a gate oxide film as thin as possible in thermal oxidation of the Si layer 13 in later steps.

An epitaxial growth process for the Si layers and the SiGe layer is disclosed in, for example, an article authored by B. S. Meyerson et al., in "Low temperature silicon epitaxy UHV/CVD", Appl. Phys. Lett, vol. 48,p 797–799, 1986 and "Cooperative growth phenomena in silicon/germanium low-temperature epitaxy", Appl. Phys. Lett., vol. 53, p 2555–2557, 1988.

Figure 3B:
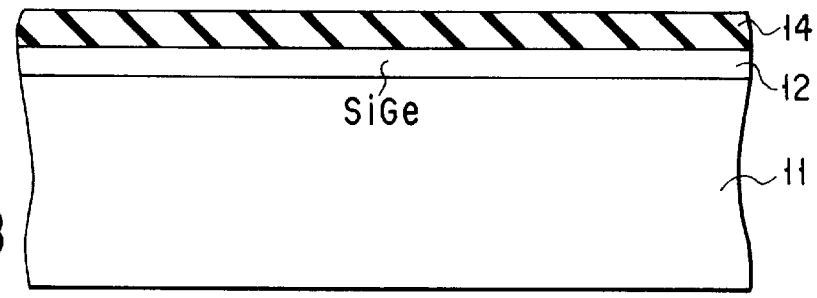

Then, as shown in FIG. 3B, a thermally oxidized film 14 with a thickness of about 20 nm served as a gate oxide of a pMOSFET is formed by thermally oxidizing the whole surface. On this occasion, the thermally oxidized film 14 is preferably formed without any oxidation of the SiGe layer 12 under compressive strain. Generally, when a gate insulating film is formed by thermally oxidizing a SiGe layer, an boundary level density gets higher, which then causes increase in a leakage current in an operation condition. Thereafter, ion implantation is conducted in a channel layer through a thermally oxidized film for adjustment of a threshold value to form a p-channel region (not shown).

Figure 3C:
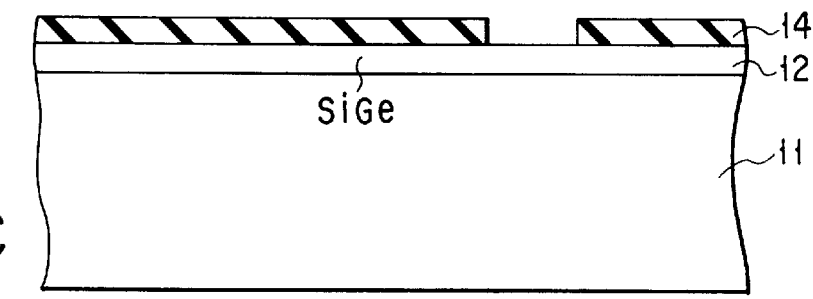
Figure 3D:
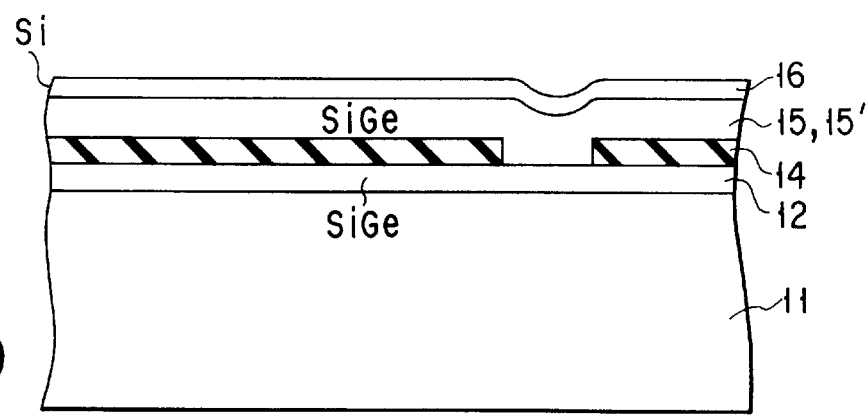

The thermally oxidized film 14 is partly removed by selective etching to form openings, as shown in FIG. 3C. Thereafter, an amorphous $Si_{0.7}Ge_{0.3}$ layer 15' with a thickness of about 200 nm is formed by means of a CVD all over the surface of the substrate, as shown in FIG. 3D. The substrate covered with the amorphous layer is thermally treated in a nitrogen atmosphere at about 600° C. using, for example, an electric furnace. As a result, the amorphous SiGe layer 15' is crystallized starting at the openings and a relaxed-SiGe thin film 15 with a thickness of about 200 nm (a second silicon-germanium layer) is produced from the amorphous layer 15'.

Thus obtained relaxed-SiGe layer 15 of a thin film is difficult to be formed on an Si substrate in a common epitaxial process and can be only formed in such a solid phase epitaxial method with ease.

An Si layer 16 with a thickness of 30 nm is formed on the SiGe layer 15 at a growth temperature of 500° C. by means of an epitaxial growth process, when the Si layer 16 under tensile strain is formed on the relaxed-SiGe layer 15.

Figure 3E:
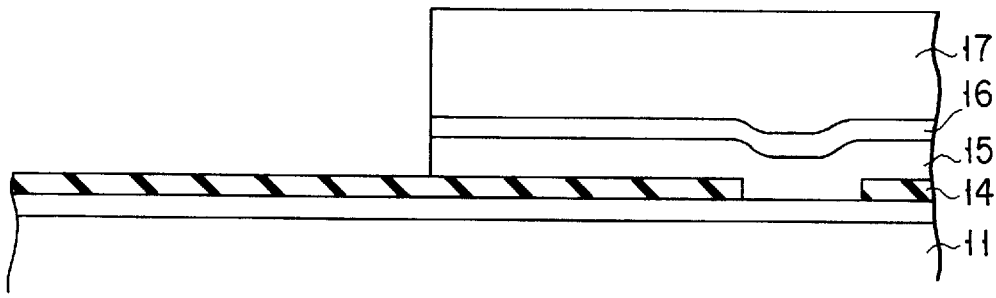

Then, a resist is applied on the surface and radiation-exposure and development are followed to form a resist pattern 17 in regions in which an nMOSFET is to be formed, as shown in FIG. 3E. A common CDE (chemical dry etching) or an RIE (reactive ion etching) is applied to the substrate to remove respective parts of the Si layer 16 and the SiGe layer 15 where a pMOSFETs is to be formed using the resist pattern 17 as a mask.

Figure 3F:
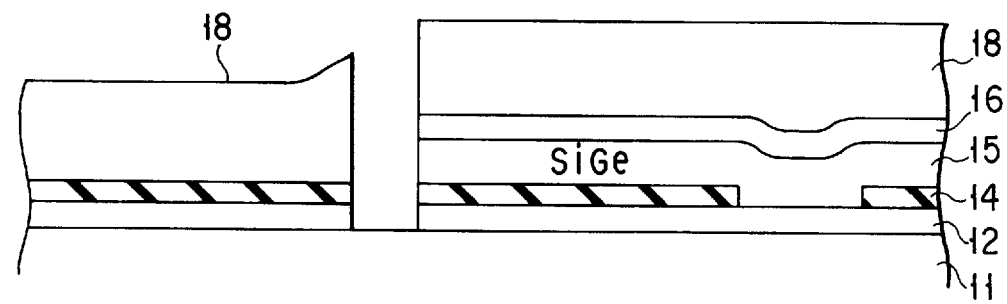

After the resist pattern 17 is removed, a resist is again applied and radiation-exposure and development are followed to form a resist pattern 18 in a region other than a region where device isolation is to be built-in, as shown in FIG. 3F. Parts of the thermally oxidized film 14 and the SiGe layer 12 on a surface of the substrate where device isolation regions are to be formed are removed by means of a common CDE (chemical dry etching) or an RIE (reactive ion etching) using the resist pattern as a mask.

Figure 3G:
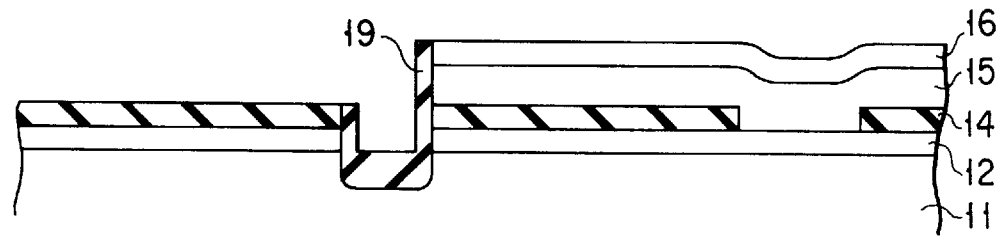

After the resist pattern 18 is removed, the device isolation region 19 is formed by a LOCOS isolation method or a trench isolation method to isolate a region where an nMOSFET is to be formed from regions where a pMOSFET is to be formed, as shown in FIG. 3G.

Figure 3H:
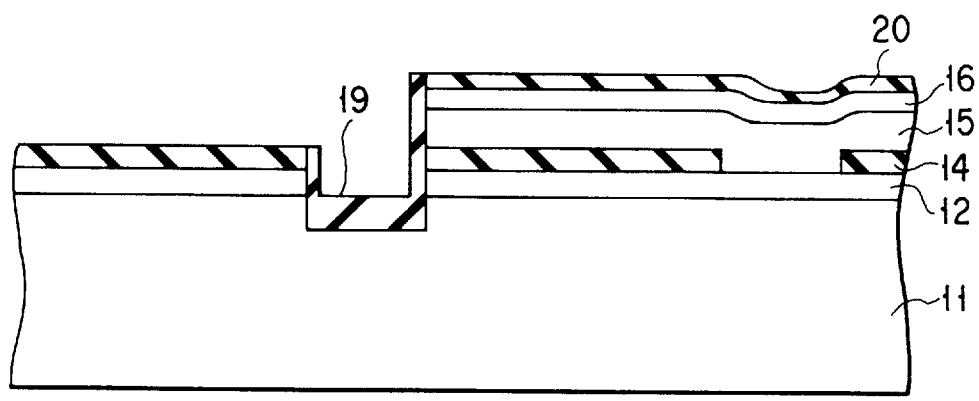
Figure 3I:
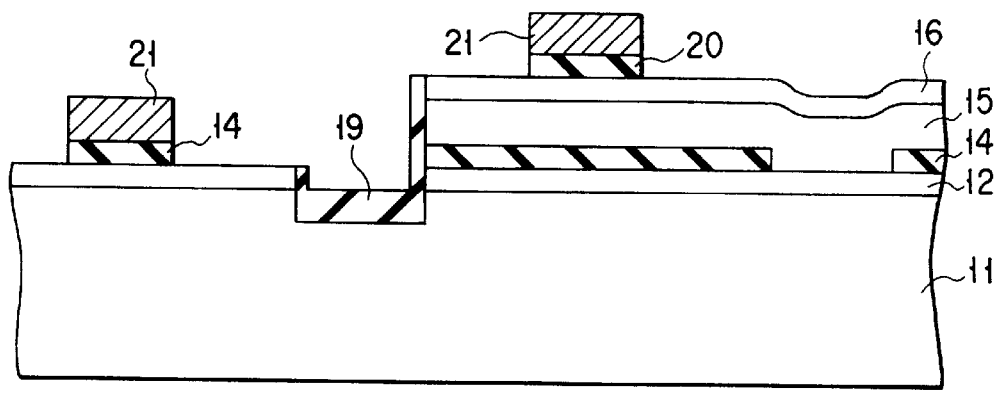
Figure 3J:
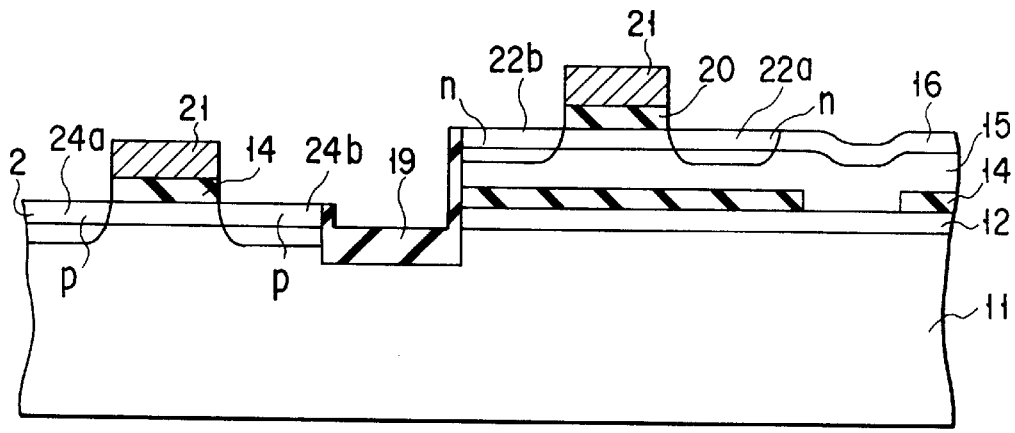

All the surface of the substrate with the device isolation region 19 is thermally oxidized to form a gate oxide film 20 with a thickness of about 10 nm in a region where the nMOSFETs are to be formed, as shown in FIG. 3H. Then, an ion implantation is conducted through the gate oxide film 20 to an n-channel region in order to adjust a threshold value and, as a result, the n-channel region (not shown) is formed.

A polysilicon layer is formed on gate oxide layers 14, 20 by means of a low pressure CVD and the polysilicon layer is processed by RIE to form gate electrodes 21 in respective regions where a pMOSFET and an nMOSFET are to be formed. On this occasion, the gate oxide films 14, 20 are processed at the same time with the same pattern by the RIE.

Phosphorus is selectively ion-implanted in regions for an nMOSFET to form an n-type source region 22a and an n-type drain region 22b and boron is also ion-implanted selectively in regions for a pMOSFET to form a p-type source region 24a and a p-type drain region 24b. Thereafter, a thermal treatment is conducted at about 800° C. to activate the implanted impurities.

Figure 3K:
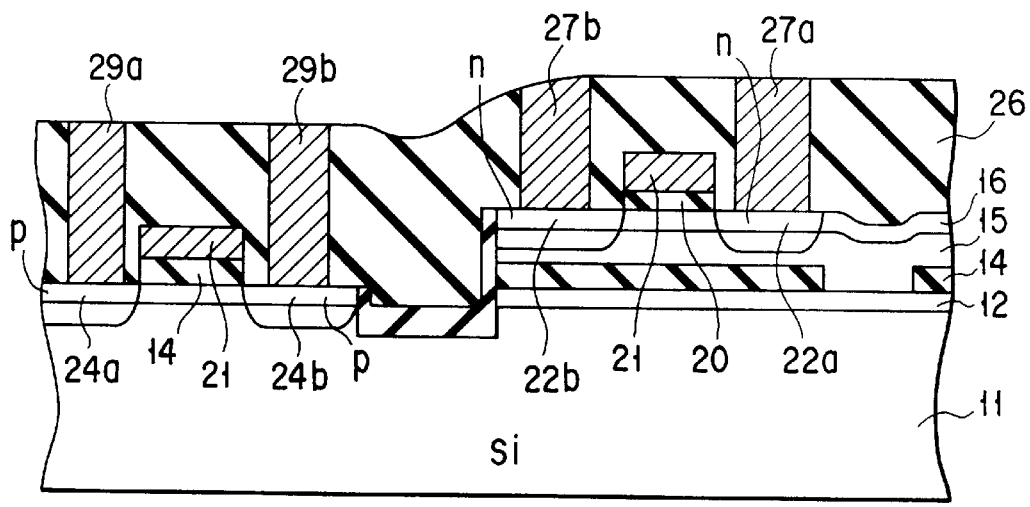

After a layer insulation film 26 such as an Si oxide film is formed all over the surface by means of a CVD, contact holes for MOSFETs are opened in the layer insulation film 26, as shown in FIG. 3K. Finally, a conductive film such as an Al film is deposited all over the surface and then the conductive film is patterned to form a source electrode 27a, a drain electrode 27b and a gate electrode (not shown) of an nMOSFET and a source electrode 29a, a drain electrode 29b and a gate electrode (not shown) of a pMOSFET, so that integrated circuit is completed.

Figure 4:
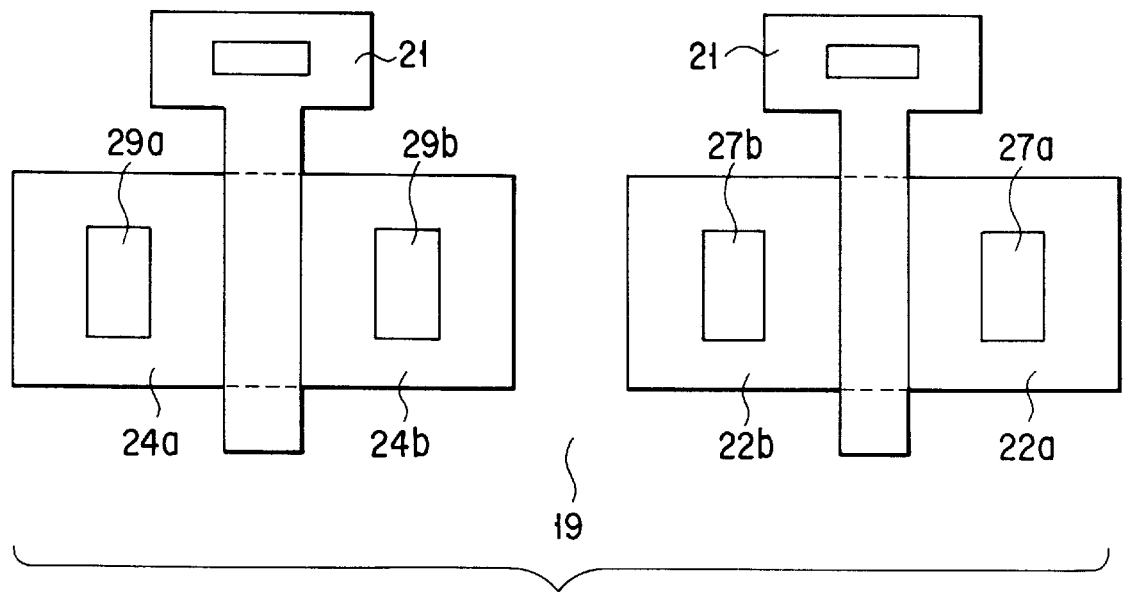
FIGS. 4 is a plan view showing a schematic configuration in a semiconductor device according to the first embodiment.

FIG. 4 shows a plan view of the integrated transistor. In the figure, a channel region for a pMOSFET (lateral stripes) is mainly made of an SiGe layer under compressive strain and a channel region (oblique lines) of an nMOSFET is made of an Si layer under tensile strain. Both MOSFETs are formed in a normally-off type, the gates of both MOSFETs are connected to each other so as to be an input terminal, the drains are also connected to each other so as to be an output terminal and a CMOS inverter can be formed by connecting the respective sources to an electric source and a ground terminal.

According to the embodiment, since the nMOSFET which uses the Si layer 16 under tensile strain as a channel region and pMOSFET which uses the SiGe layer 12 under compressive strain as a channel region can be formed on the same substrate in a thin film layered structure, characteristics of both strained layers are sufficiently utilized and the integrated transistor can be improved toward a higher speed and a higher performance.

Moreover, in the embodiment, an SOI structure is utilized in a region to form an nMOSFET and a parasitic capacitance of a device can be reduced by a great margin through an effective use of the feature, so that improvements toward a higher speed and a higher performance of the integrated transistor can be further promoted.

FIGS. 5A to 5D are sectional views showing a fabrication process of a semiconductor device according to a second embodiment. In the figures, parts corresponding to those in FIGS. 3A to 3K are indicated at the same marks as those in FIGS. 3A to 3K and detailed explanations are omitted.

Points of the second embodiment different from the first embodiment already described are in that an SiGe layer 15 in a lattice-relaxation condition is formed by means of a selective epitaxial process and a solid phase epitaxial process.

Figure 5A:
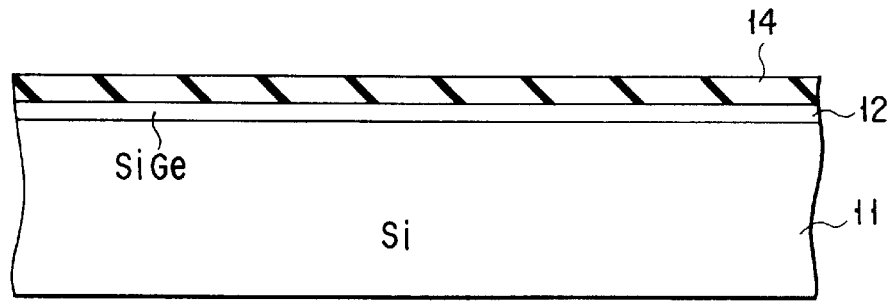
FIGS. 5A to 5D are sectional views showing a fabrication process of a semiconductor device according to a second embodiment.
Figure 5B:
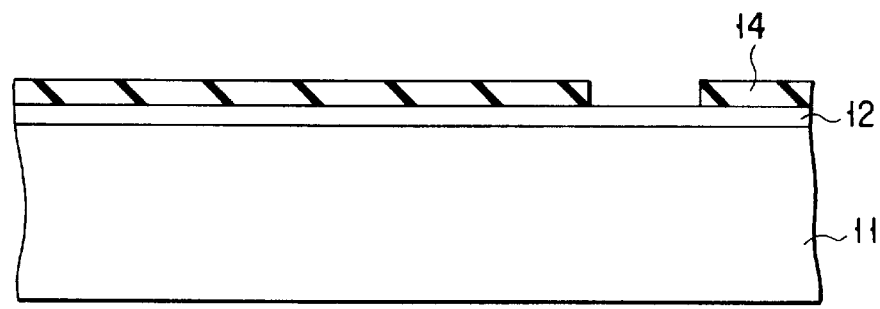

As shown in FIG. 5A, an Si substrate 11 with an $Si_{0.7}Ge_{0.3}$ layer and a thermally oxidized film 14 formed on the surface is prepared as a first step. Then, openings are formed by removing part of the thermally oxidized film 14 with selective etching. Up to this point, a process is similar to that of FIGS. 3A to 3C of the first embodiment.

Figure 5C:
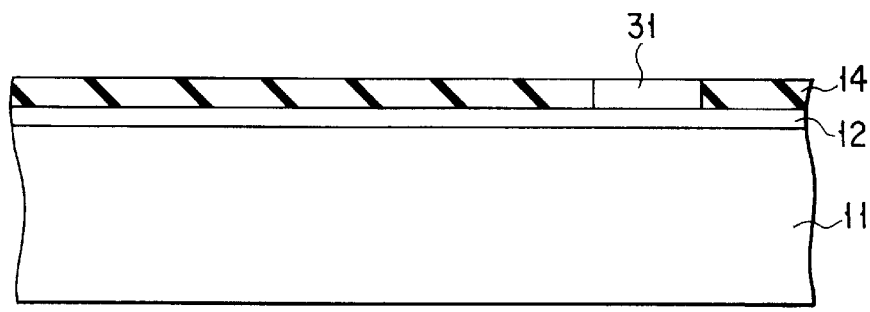

A single crystal $Si_{0.7}Ge_{0.3}$ layer 31 is formed in a buried manner in the openings of the thermally oxidized film 14 by a selective epitaxial process, as shown in FIG. 5C.

Figure 5D:
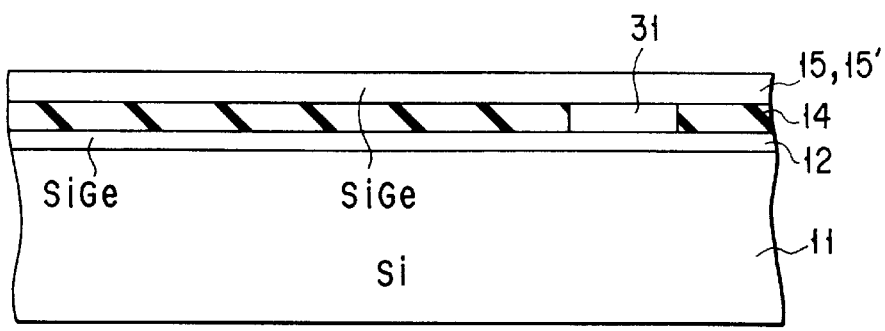

Thereafter, as shown in FIG. 5D, an amorphous $SiO_{0.7}Ge_{0.3}$ layer 15' with a thickness of 20 nm is formed all over the surface of the substrate by means of a CVD. Subsequently, the substrate is subjected to a heat treatment in an $N_2$ atmosphere at 600° C. using an electric furnace to crystallize the amorphous $Si_{0.7}Ge_{0.3}$ layer 15' in solid phase growth, which crystallization originates from the single crystal SiGe layer 31, so that a SiGe layer 15 in a lattice-relaxation condition can be produced.

The rest of steps of the fabrication process is a duplicate of the fabrication process shown in the first embodiment and a similar integrated transistor can be fabricated by following the rest of steps.

It should be noted that the present invention is not restricted to the first and second embodiments above described.

The thicknesses of the first and second silicon-germanium layers and silicon layers are not limited to those shown in the embodiments, but changeable depending on specifications of a device. That is, a thickness of the first silicon-germanium layer is not limited to 50 nm, but is only required to be equal to or less than a critical value which is determined by a Ge composition and a growth temperature. A thickness of the second silicon-germanium layer is not limited to 200 nm, but is only required to be a thickness with which an amorphous layer after crystallization can be attained as a crystal layer in a lattice-relaxation condition. A thickness of the silicon layer is only required to be equal to or a thickness with which a tensile strain condition is maintained.

A gate insulation film is not necessarily limited to a silicon oxide film formed by thermal oxidation in the above embodiments, but an oxide film other than an oxide formed in thermal oxidation or an insulating film other than an oxide film can be used instead.

Figure 6:
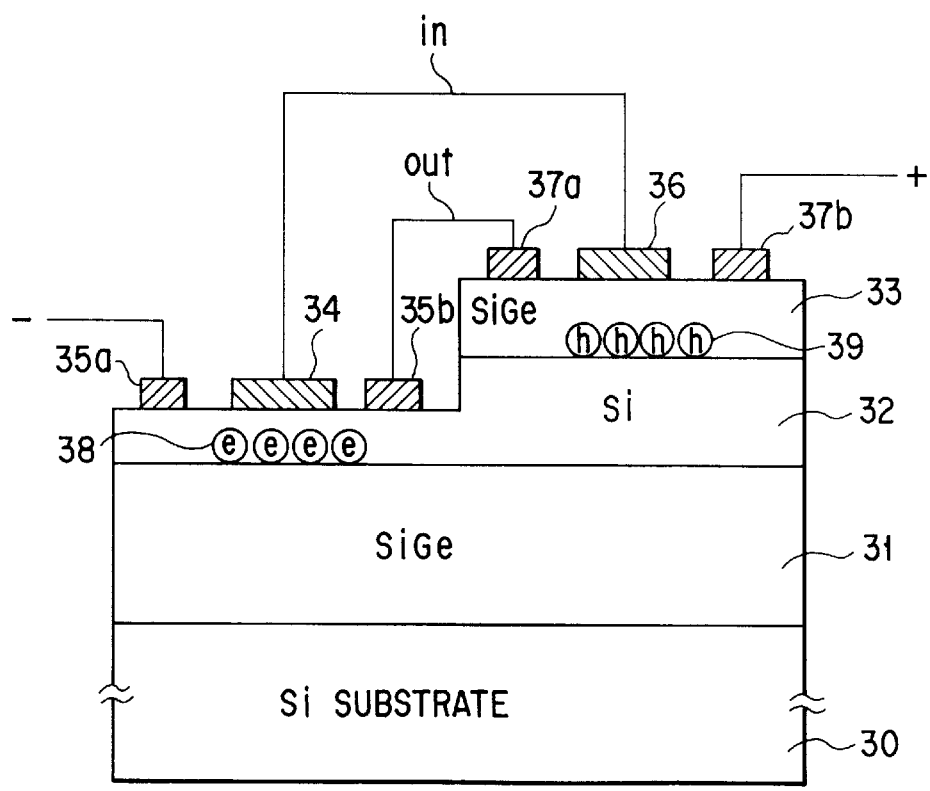
FIG. 6 shows a fundamental configuration of a complementary semiconductor device of the present invention.

FIG. 6 is a sectional view showing a fundamental structure of a complementary semiconductor device according to the second aspect of the present invention. The following layers are successively formed on an Si substrate 30 in the order of: a first semiconductor layer 31 made of an SiGe layer in a lattice-relaxation condition, a second semiconductor layer 32 made of an Si layer under tensile strain and a third semiconductor layer 33 made of SiGe in a lattice-relaxation condition.

Part of the first semiconductor layer 31 is n-doped to form a electron supplying layer. The second semiconductor layer 32 is divided two parts, one part of which adjoins the first semiconductor layer 31 and which is an undoped or a low doped layer which becomes an n-channel layer and the other of which adjoins the third semiconductor 33 located upward of the second layer 32 and which becomes a p-doped layer. The third semiconductor layer 33 is an undoped or a low doped layer and becomes a p-channel layer.

A p-type gate electrode 36 controls a hole concentration under the gate. Reference numerals 37 (37a, 37b) indicate p-type source and drain electrodes which are disposed on both sides of the p-type gate electrode 36. Reference numeral 39 indicates two-dimensional hole gas accumulated at a interface between a p-doped portion of the strain Si layer 32 and the SiGe layer 33 in a lattice-relaxation condition on the side of the Si Ge layer side 33. In the embodiment, a channel portion in which the two-dimensional hole gas 39 flows is separated spatially from the p-doped portion and thereby a higher mobility can be realized.

In this case, the semiconductor layers 31, 32, 33 and electrodes 36, 37 form a p-channel heterojunction FET with a inverted structure. The p-channel heterojunction FET is fabricated by controlling doping of p-type impurity so as to be desirably of a normally-off type. In a concrete manner, a doping concentration is reduced or a spacer layer is made to be thicker, or the doping layer may be made to be thinner. Such circumstances are shown in FIGS. 7A and 7B.

Figure 7A:
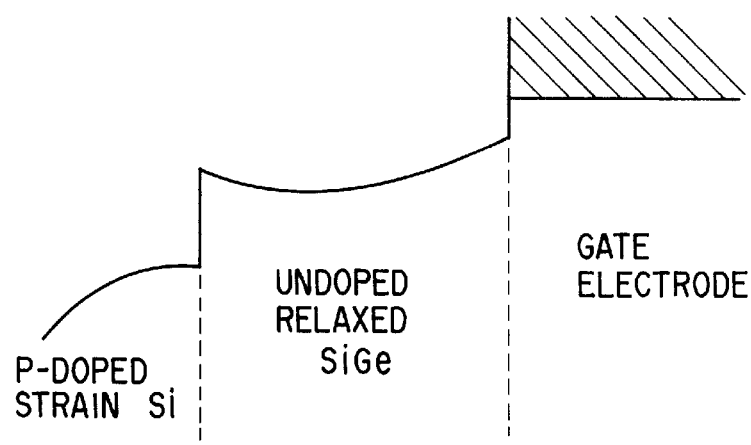
FIGS. 7A and 7B are representations showing a principle operation of a p-channel hetrojunction FET of the present invention.
Figure 7B:
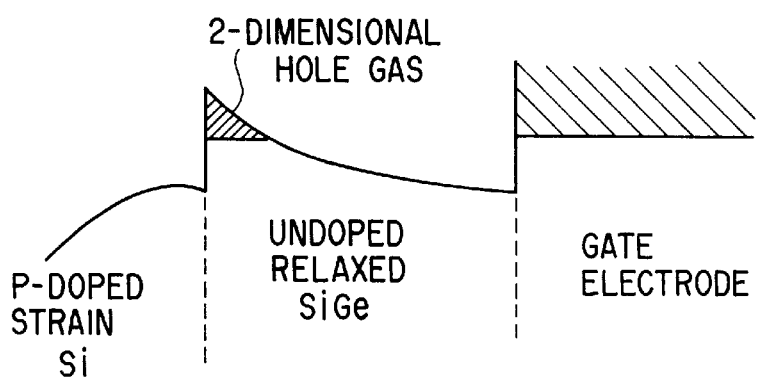

In a situation where a voltage is not applied to a gate electrode 36, holes are not present at an interface between the strain Si layer (p-doped) and the relaxed SiGe layer (undoped), as shown in FIG. 7A. When Vg is applied to the gate electrode 36, wherein—Vtp>Vg is satisfied and Vtp is a positive absolute value, a band diagram has a form of FIG. 7B and two-dimensional hole gas with a high mobility is produced at a hetrojunction interface between the relaxed SiGe layer and the strain Si layer. In this situation, when a electric field is applied between source/drain regions, a hole current flows and a p-channel heterojunction FET is turned to an on state.

An n-type gate electrode 34 is disposed on an undoped portion of the strain silicon layer 32 after the relaxed SiGe layer 33 and the strain silicon layer 32 are partly removed. An n-type source electrode and an n-type drain electrode 35 (35a, 35b) are disposed on both sides of the n-type gate electrode 34. Two-dimensional electron gas 38 is produced at a heterojunction interface between the n-doped relaxed SiGe layer 31 which works as an electron supply layer and the undoped portion of the strain Si layer 32 on the strain Si side. In the embodiment, the two-dimensional electron gas 38 is spatially separated from the n-doped portion and thereby a high mobility can be realized.

An n-channel heterojunction FET is formed in a so-called inverted structure with the semiconductor layers 31, 32 and the electrodes 34, 35. The n-channel FET is also fabricated by controlling n-type impurity so as to be desirably of a normally-off type. Such circumstances are shown in FIGS. 8A and 8B.

Figure 8A:
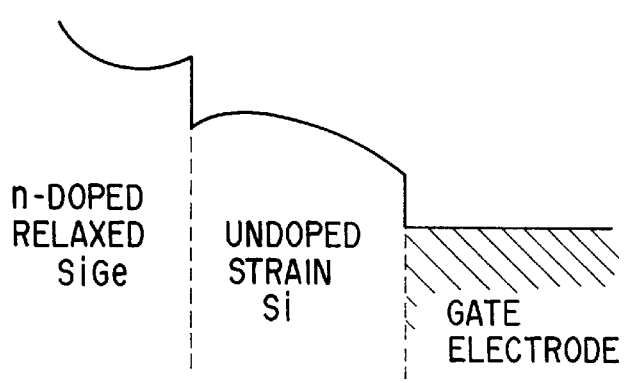
FIGS. 8A and 8B are representations showing a principle operation of an n-channel hetrojunction FET of the present invention.
Figure 8B:
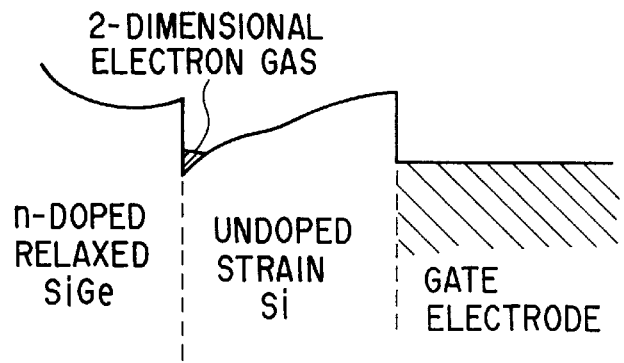

In a situation where no voltage is applied to the gate electrode 34, there are not present two-dimensional electron gas, as shown in FIG. 8A. When a positive voltage Vg>Vte is applied to the gate electrode 34, the two-dimensional electron gas with a high mobility is accumulated at a heterointerface between the relaxed SiGe layer and the strain Si layer, as shown in FIG. 8B. In this situation, if a voltage is applied between source/drain, electrons flow and a n-channel hetrojunction FET is transited to an on state.

The gate electrodes of the n-channel heterojunction FET and the p-channel heterojunction FET are connected to each other to form a common input electrode, the drain electrodes thereof are also connected to each other to from a common output electrode and in addition the input electrodes are respectively connected to an electric source, so that the FETs operate as a complementary inverter circuit.

Figure 9A:
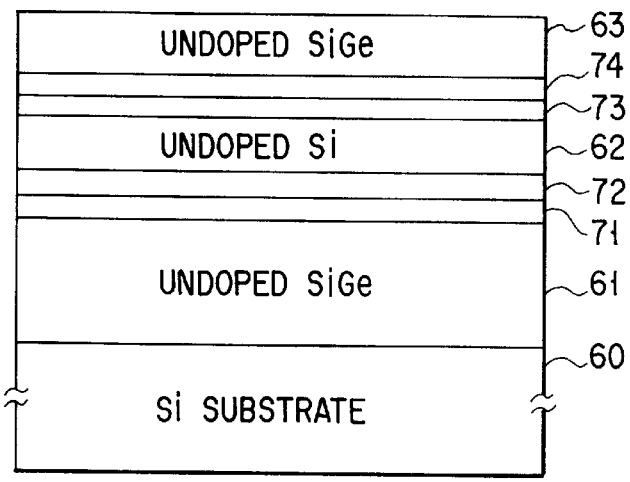
FIGS. 9A and 9B are views showing a fabrication process of a complementary inverter according to a third embodiment of the present invention.
Figure 9B:
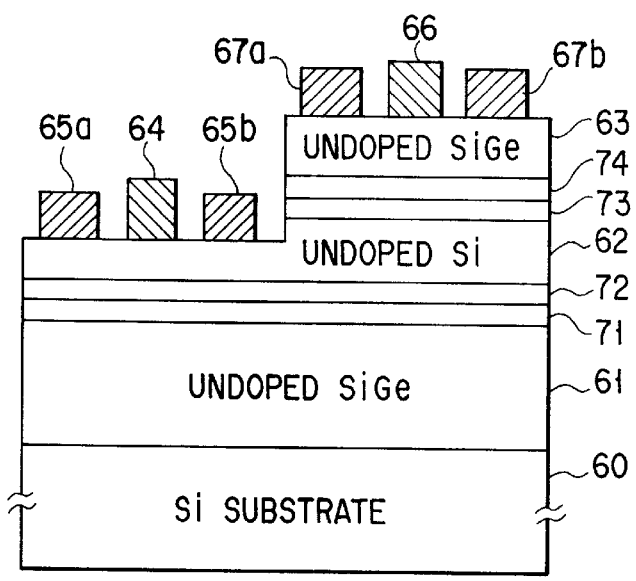

FIGS. 9A and 9B are views showing a fabrication process of a complementary inverter according to a third embodiment of the present invention.

First of all, as shown in FIG. 9A, an undoped $Si_{0.7}Ge_{0.3}$ layer 61 with a thickness of 2 $\mu$m is grown on an Si substrate 60 at 500° C. in an epitaxial growth process to form an SiGe layer 61 in a lattice relaxation condition. Subsequently, an $Si_{0.7}Ge_{0.3}$ layer 71 with a thickness of 6 nm doped with As as n-type dopant and an undoped $Si_{0.7}Ge_{0.3}$ layer 72 with a thickness of 15 nm are grown in the order. The three SiGe layers 61, 71 and 72 corresponds to the first semiconductor layer and work as an electron supply layer. The reason why the undoped SiGe layer 72 is grown on the n-doped SiGe layer 71 is to realize a higher mobility by disposing a spacer layer between the channel region and the electron supplying layer.

An undoped strain Si layer 62 with a thickness of 100 nm served as an electron channel layer, a strain Si layer 73 with a thickness 10 nm which is doped with B as a p-type dopant at $2 \times 10^{17}$ and served as a hole supply layer and an undoped strain Si spacer layer 74 with a thickness 15 nm are deposited in that order. The three strain layers correspond to the second semiconductor layer. An undoped relaxed $Si_{0.7}Ge_{0.3}$ layer 63 with a thickness of 30 nm as a third semiconductor layer served as a hole channel layer is grown on the undoped strain Si spacer layer 74.

Then, as shown in FIG. 9B, only respective parts of the undoped relaxed SiGe layer 63, the undoped strain Si layer 74, the p-type strain Si layer 73 and the undoped strain Si layer 62 are removed by an etching process as a portion where an n-channel heterojunction FET is formed. As a result of measurement, an etching removal of the undoped strain Si layer 62 was found to be 40 nm.

Then, AuSb was evaporated as source/drain electrodes 65a, 65b of the n-channel heterojunction FET to a thickness of 150 nm, Ti/Al was evaporated as source/drain electrodes 67a, 67b of a p-channel heterojunction FET to a total thickness of 100 nm in which 3 nm is for Ti and 100 nm for Al and the substrate was heat-treated at 400° C. for 10 min. As gate electrodes 64, 66, Ti/Pt was used in both of the p-channel and n-channel FETs.

Then, $SiO_2$ was deposited as an insulating layer, contact holes were opened in the $SiO_2$ above the respective electrodes of source, drain and gate and metallization for interconnection was performed with Al, which is not shown. A completed complementary circuit was confirmed work as an inverter.

Figure 10:
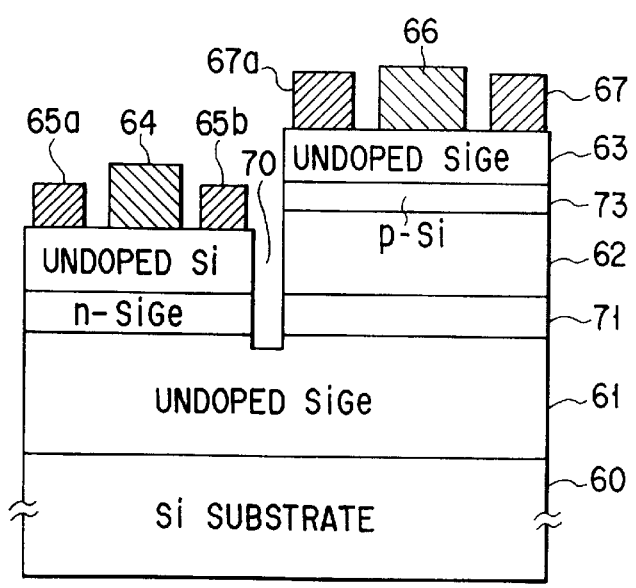
FIG. 10 shows an internal structure of a complementary inverter according to a fourth embodiment of the present invention.

FIG. 10 is a sectional view showing an internal structure of a complementary inverter according to the fourth embodiment of the present invention. In FIG. 10, the same parts as those in FIGS. 9A and 9B are indicated at the same marks as those in FIGS. 9A and 9B and detailed description is omitted.

The embodiment is different from the third embodiment already described in that a trench device isolation structure is formed between a p-channel heterojunction FET and an n-channel heterojunction FET to make element isolation complete and to reduce a leakage current. As an element isolation method, an insulating region formed by ion-implantation and the like can be substituted and a similar effect is obtained. In the embodiment, undoped spacer layers 72,73, which are not inserted in the embodiment, may be respectively inserted in the p-channel and n-channel heterojunction FETs, as similar to the third embodiment.

In the third and fourth embodiments, a contact resistance of each of ohmic electrodes of the source and the drain ohmic electrode were large. The reason why was that contacts of the electrodes with the two-dimensional electron gas or the two-dimensional hole gas were not enough.

Figure 11A:
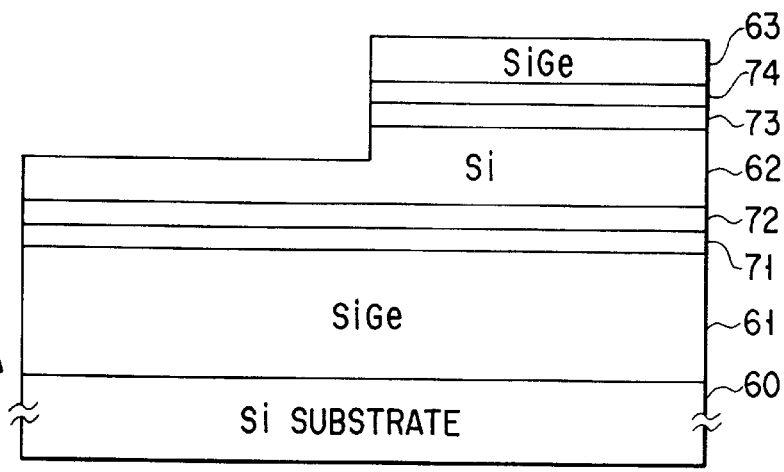
FIGS. 11A to 11C are views showing a fabrication process of a complementary inverter according to a fifth embodiment of the present invention.
Figure 11B:
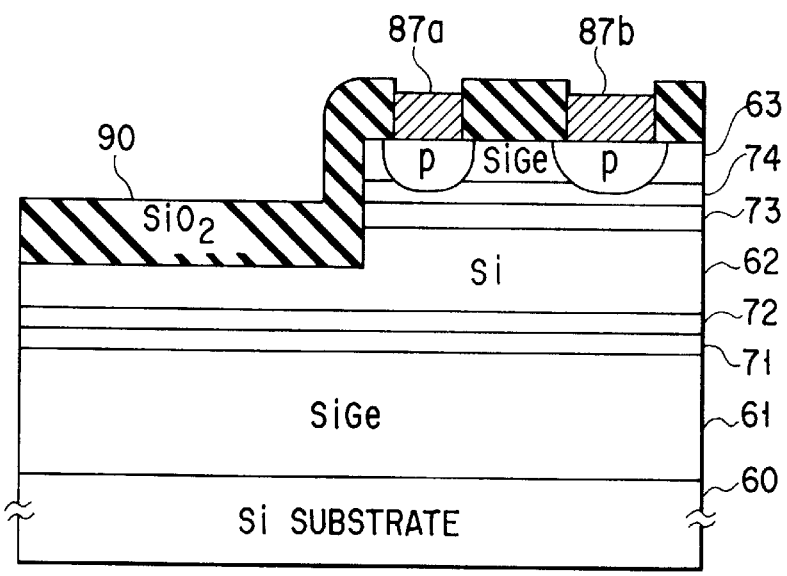
Figure 11C:
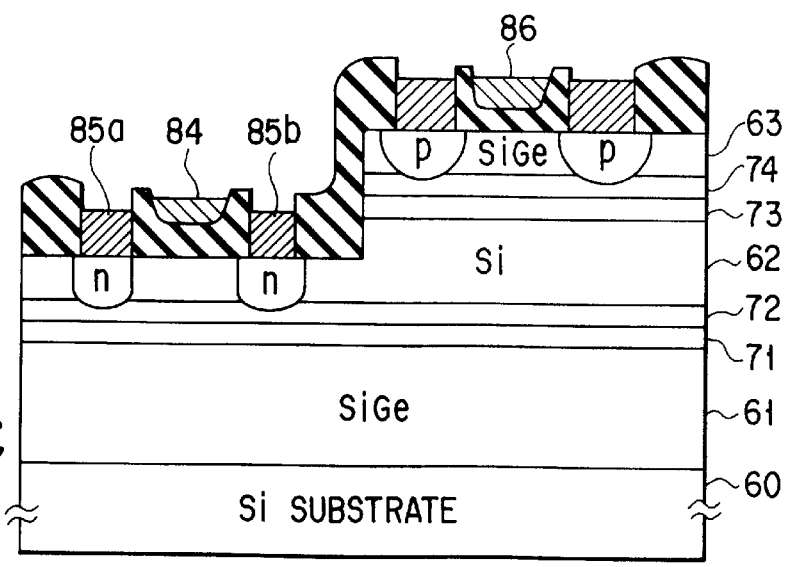

An embodiment to avoid such a trouble in which a MOS structure is utilized for a gate electrode is shown. FIGS. 11A to 11C are sectional views showing a fabrication process of a complementary inverter according to a fifth embodiment of the present invention.

First of all, as similar to the third embodiment, layers 61 to 63 and 71 and 74 are formed on a Si substrate and respective parts of the SiGe layer 63, the Si layer 74, the Si layer 73 and the strain Si layer 62 where a n-channel heterojunction FET was to be formed were only removed by an etching process, which situation is shown in FIG. 11A.

Then, as shown in FIG. 11B, an $SiO_2$ insulating film 90 was formed all over the surface, thereafter, parts of the $SiO_2$ corresponding to p-type source/drain electrodes are removed, subsequently metal is evaporated thereon as p-type source/drain electrodes 87 (87a, 87b) and further a heat treatment was given, whereby the source/drain electrodes 87 were diffused not only in a direction of depth but in a lateral direction, so that the electrodes 87 were able to contact directly with the two-dimensional hole gas.

Then, as shown in FIG. 11C, n-type source/drain electrodes were formed in a similar way to that of the case of the p-type source/drain electrodes. Finally, after the $SiO_2$ in the gate region was etched off to a proper depth, metal was evaporated to form gate electrodes 84, 86.

A complementary circuit thus fabricated by interconnecting the heterojunction FETs was able to improve characteristics further, because of reduction in ohmic resistance of the source/drain electrodes.

FIGS. 12A to 12D are sectional views showing a fabrication process of an inverter according to a sixth embodiment of the present invention. In FIGS. 12A to 12D, the same parts as those in FIGS. 9A and 9B are indicated at the same marks as those in FIGS. 9A and 9B and detailed description is omitted.

The embodiment is different from the third to fifth embodiments already described in that a relaxed-SiGe layer 61 is formed by means of a solid phase epitaxial process.

Figure 12A:
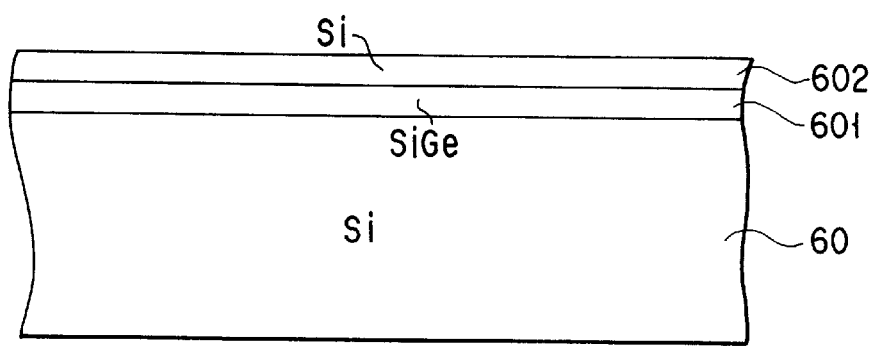
FIGS. 12A to 12D are sectional views showing a fabrication process of an inverter according to a sixth embodiment of the present invention.

First of all, as shown in FIG. 12A, an Si substrate 60 was cleaned by, for example, an RCA method, an undoped $Si_{0.7}Ge_{0.3}$ layer 601 with a thickness of 50 nm is formed at a growth temperature of 500° C. by means of an epitaxial growth process. In this case, a thickness of the SiGe layer 601 is required to be set equal to or less than a critical value which is determined in accordance to a Ge composition and a growth temperature in order to place the SiGe layer under compressive strain.

A Ge composition is desirably in the range of 20 to 50%. In the case of a Ge composition less than 20%, increase in a mobility cannot be expected and, on the other hand, in the case of a Ge composition is larger than 50%, a quality and morphology are both degraded and improvement of electric characteristics are also hopeless.

A thickness of the SiGe layer 601 is desirably in the range of 40 to 300 nm for a Ge composition in the range of 20 to 50%. In the case larger than the upper limit, it is difficult to place the SiGe layer 601 under compressive strain.

Then, an undoped Si layer 602 with thickness of the order of 50 nm was formed on the SiGe layer 601 at a growth temperature of 500° C. by means of an epitaxial growth process in a similar manner. The epitaxial process employed in formation of the SI and SiGe layers is disclosed in the reference authored by B. S. Meyerson et al. which has been already described herein.

Figure 12B:
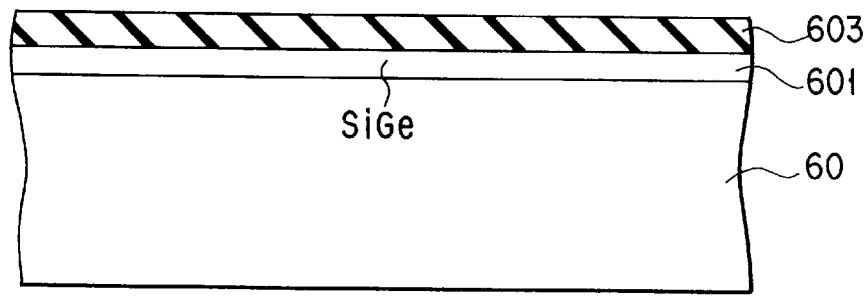

Then, as shown in FIG. 12B, all the surface was thermally oxidized to form an oxide film 603 with a thickness of the order of 70 nm was formed. In this case, the oxide film is desirably formed without any oxidation of the SiGe layer 601 under compressive strain. The reason why is that, generally, when a SiGe layer is thermally oxidized to form an interface between an oxide film and an SiGe layer, a Ge-rich layer is formed at the interface, a film quality of the oxide film itself is degraded and at the same time interface roughness is produced. The oxide film on the SiGe layer 601 can be made by means of a method other than thermal oxidation, such as a CVD without limiting a method to the above mentioned method.

Figure 12C:
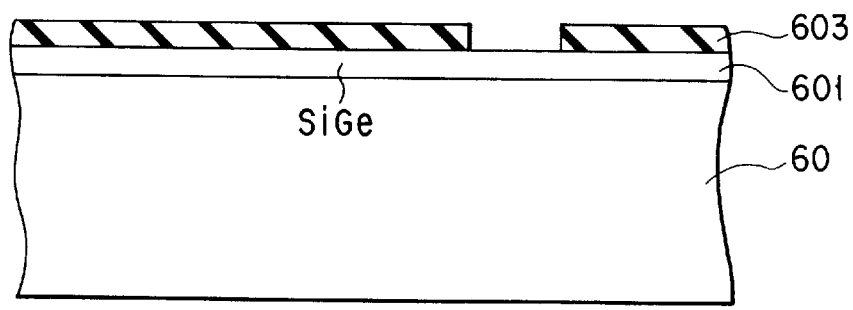

Then, opening is made in the oxide layer 603 by partly etching with selective etching as shown in FIG. 12C.

Figure 12D:
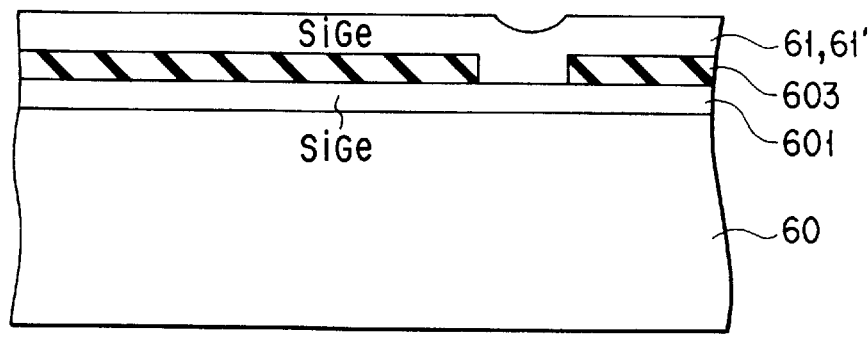

An undoped amorphous $Si_{0.7}Ge_{0.3}$ layer 61' with the thickness of the order of 200 nm is formed all over the substrate surface by using CVD method, as shown in FIG. 12D. Thereafter, the substrate is subjected to a heat treatment in an $N_2$ atmosphere at 600° C. using, for example, an electric furnace. As a result of the heat treatment, the amorphous SiGe layer 61 starts crystallization with the opening being the first region to crystallize and a relaxed SiGe layer made of a thin film with a thickness as small as of the order of 200 nm can be produced on the oxide layer 603. The relaxed SiGe layer made of a thin film is difficult to be formed in a method employing a common epitaxial process, but can be only formed with ease by means of a solid phase epitaxial method.

The rest of steps of the fabrication process in the embodiment which starts with formation of an SiGe layer 71 are the same as those in the third embodiment and, therefore, the process may follow the steps in the third embodiment from formation of the SiGe layer 71 and, as a result, a similar complementary inverter can be fabricated.

In the embodiment, since an SOI structure is utilized in a region where a device is formed, a great reduction in parasitic capacitance of a device can be realized by utilization of the feature, which can be resulted in advancement toward a higher speed and a higher performance.

FIGS. 13A to 13D are views showing a fabrication process of a complementary inverter according to a seventh embodiment of the present invention. In FIGS. 13A to 13D, parts corresponding to those in FIG. 6 are indicated at the same marks as those in FIG. 6 and detailed description is omitted.

The embodiment is different from the sixth embodiment in that a relaxed SiGe layer 61 is formed by means of a selective epitaxial process and a solid phase epitaxial process.

First of all, as shown in FIG. 13A, an Si substrate 60 with an undoped $Si_{0.7}Ge_{0.3}$ layer 601 and a thermally oxidized film 603 is prepared.

Parts of the thermally oxidized film 603 is removed by selective etching to form an opening, as shown in FIG. 13B. In this case, steps employed are the same as those in FIGS. 12A to 12C of the sixth embodiment.

A single crystal $Si_{0.7}Ge_{0.3}$ layer 604 is formed in the openings of the thermally oxidized film 603 by means of a selective epitaxial process, as shown FIG. 13C.

An undoped $Si_{0.7}Ge_{0.3}$ layer 61' with a thickness of the order of 200 nm is formed across the surface of the substrate by means of a CVD, as shown in FIG. 13D, after the selective epitaxial process. Thereafter, the substrate is subjected to a heat treatment in an $N_2$ atmosphere at about 600° C. using, for example, an electric furnace and the amorphous SiGe layer 61' can be crystallized to produce a relaxed SiGe layer 61.

The rest of steps of the fabrication process of the embodiment from formation of an SiGe layer 71 which comes as next step is the same as those of the fabrication process of the first embodiment. Therefore, Steps from formation of an SiGe of the first embodiment may be followed in the embodiment and, as a result, a similar complementary inverter can be fabricated.

A thickness of each of the SiGe layers 601 and 61' is not limited to the value shown in the embodiment, but is properly changeable according to specifications. In more detail, a thickness of the SiGe layer 601 is not limited to a value of 50 nm, but may be set at a critical value which is determined by a Ge composition and a growth temperature in order to place the layer in a compressed strain condition. A thickness of the SiGe layer 61' is not limited to 200 nm, but may be set at a value at which the layer can be placed in a lattice-relaxation condition after recrystallization by annealing the layer originally in an amorphous state.

It should be noted that the above embodiments are not intended to restrict the present invention to the descriptions.

SiGe layers with a composition other than $Si_{0.7}Ge_{0.3}$, in which a mixed crystal ratio between Si and Ge is 7 to 3, and which has been used in the above embodiments, can be used as the first and third semiconductor layers. A combination of $Si_{0.7}Ge_{0.3}$ as a first semiconductor layer served as an electron supplying layer, and $Si_{0.6}Ge_{0.4}$ as a third semiconductor layer served as a hole channel can be effected, wherein two kinds of SiGe with different mixed crystal ratios, one of which is used in n-channel and the other of which is used in p-channel are selected. In such a manner, since a magnitude of band offset and a degree of strain can be freely controlled, structures of a p-channel heterojunction and an n-channel heterojunction FETs can be individually optimized. Moreover, for example, as a first and third semiconductor layers are grown, a mixed crystal ratio in a structure is gradually changed.

As far as a p-channel heterojunction FET is in a normally-off state and a threshold voltage is a proper value less in absolute value than an electric source, a kind of impurity, a doping concentration, a doping profile in film thickness and a thickness of an undoped channel layer can be freely set. This can be applied in a similar way to the case where an n-channel heterojunction FET is fabricated. It is desirable to adopt a normally-off type in common with both cases of p-channel and n-channel FETs from a view point of low power consumption, but even with a normally-on type both FETs have an sufficient effect of a higher working speed.

The present invention have been described using a complementary inverter in the above embodiments. However, it should be understood that the present invention is not necessarily limited to this device, but can be applied to any semiconductor device as far as it has a p-channel heterojunction FET and an n-channel heterojunction FET integrated on the same substrate.

As an insulating film in a solid phase epitaxial process, a thermally oxidized film is used in the embodiments. It is not necessarily limited to a thermally oxidized film, but oxide films other than a thermally oxidized film or insulation films other than oxide films can be substituted. In addition, various changes in and modifications of the embodiments can be carried out without departing from the scope of the present invention.

Additional advantages and modifications will readily occurs to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

We claim:

1. A semiconductor device comprising:

a semiconductor substrate;

a first semiconductor layer under compressive strain formed on the semiconductor substrate;

a p-type MISFET (Metal Insulator Semiconductor Field Effect Transistor) formed in a predetermined region of the first semiconductor layer;

a second semiconductor layer in a lattice-relaxation condition formed on the first semiconductor layer in a region other than the predetermined region with an insulating film lying therebetween, wherein the insulating film has an opening and the first and second semiconductor layers are connected through the opening;

a third semiconductor layer under tensile strain formed on the second semiconductor layer; and an n-type MISFET (Metal Insulator Semiconductor Field Effect Transistor) formed in the third semiconductor layer.

2. A method of fabricating a semiconductor device comprising the steps of:

providing a semiconductor substrate;

forming a first semiconductor layer under compressive strain on the semiconductor substrate;

forming an insulating film having an opening on the first semiconductor layer;

depositing a semiconductor layer having an amorphous silicon-germanium as a principal component on the insulating film;

forming a second semiconductor layer in a lattice-relaxation condition by subjecting the semiconductor layer having the amorphous silicon-germanium as a principal component to a heat treatment;

forming a third semiconductor layer under tensile strain on the second semiconductor layer;

removing parts of the third and second semiconductor layers;

forming a p-type MISFET (Metal Insulator Semiconductor Field Effect Transistor) in a region of the first semiconductor layer exposed after the parts of the third and second semiconductor layers have been removed; and forming an n-type MISFET (Metal Insulator Semiconductor Field Effect Transistor) in the third semiconductor layer.

3. A method of fabricating a semiconductor device according to claim 2, wherein said insulating film forming step includes substeps of forming a semiconductor layer having a silicon as a principal component on the first semiconductor layer, and oxidizing the semiconductor layer having the silicon as a principal component.

4. A method of fabricating a semiconductor device according to claim 2, wherein said semiconductor layer depositing step includes substeps of forming a semiconductor epitaxial layer having crystal silicon-germanium as a principal component in the opening, and forming a semiconductor layer having amorphous silicon-germanium as a principal component.

* * * * *